(12) United States Patent
Ono et al.

(10) Patent No.: US 6,835,245 B2
(45) Date of Patent: Dec. 28, 2004

(54) METHOD OF MANUFACTURING EPITAXIAL WAFER AND METHOD OF PRODUCING SINGLE CRYSTAL AS MATERIAL THEREFOR

(75) Inventors: Toshiaki Ono, Saga (JP); Tadami Tanaka, Saga (JP); Eiichi Asayama, Saga (JP); Hideshi Nishikawa, Saga (JP); Masataka Horai, Saga (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 117 days.

(21) Appl. No.: 09/883,922

(22) Filed: Jun. 20, 2001

(65) Prior Publication Data
US 2002/0017234 A1 Feb. 14, 2002

(30) Foreign Application Priority Data

Jun. 22, 2000 (JP) ...................................... 2000-188176
Jun. 26, 2000 (JP) ...................................... 2000-190631

(51) Int. Cl.$^7$ ............................................. C30B 33/02
(52) U.S. Cl. ......................................................... 117/3
(58) Field of Search ................................. 117/3, 13, 14, 117/15, 19, 20, 21, 11, 931, 932

(56) References Cited

U.S. PATENT DOCUMENTS

| 4,981,549 | A | * | 1/1991 | Yamashita et al. | |
|---|---|---|---|---|---|
| 5,817,171 | A | * | 10/1998 | Sakurada et al. | ............. 117/13 |
| 5,935,320 | A | * | 8/1999 | Graef et al. | ..................... 117/2 |
| 6,045,610 | A | * | 4/2000 | Park et al. | ..................... 117/13 |
| 6,077,343 | A | * | 6/2000 | Iida et al. | ......................... 117/2 |
| 6,120,598 | A | * | 9/2000 | Iida et al. | ........................ 117/13 |
| 6,179,911 | B1 | * | 1/2001 | Tomioka et al. | ............... 117/20 |
| 6,261,361 | B1 | * | 7/2001 | Iida et al. | ...................... 117/19 |

FOREIGN PATENT DOCUMENTS

| EP | 0716168 A1 | * | 6/1996 | ........... C30B/15/00 |
|---|---|---|---|---|
| EP | 0747513 A2 | * | 12/1996 | ........... C30B/15/00 |
| EP | 0890662 | * | 1/1999 | ........... C30B/15/00 |
| EP | 0909840 | * | 4/1999 | ........... C30B/15/00 |
| EP | 0962557 | * | 12/1999 | ........... C30B/15/00 |
| JP | 8-339024 | | 12/1996 | |
| JP | 10-236897 | | 9/1998 | |
| JP | 11-189493 | | 7/1999 | |
| JP | 2000-44389 | | 2/2000 | |

OTHER PUBLICATIONS

Wolf et al.,. Silicon Processing for the VLSI Era, vol. 1: Process Technology, Lattice Press, Sunset Beach, CA, USA, pp. 8–11, 27–33, 36–72, 124, 139–142, 1986.*
Japanese Journal of Applied Physics, vol. 36, No. 11 (1997) pp. 6595–6600.

* cited by examiner

Primary Examiner—Nadine G. Norton
Assistant Examiner—Matthew A. Anderson
(74) Attorney, Agent, or Firm—Westerman, Hattori, Daniels & Adrian, LLP

(57) ABSTRACT

Epitaxial wafers showing marked IG effects can be manufactured from silicon single crystals doped or not doped with nitrogen without requiring any additional heat treatment process step while reducing the density of epitaxial layer defects. According to the first manufacturing method, an epitaxial layer is allowed to grow on the surface of a wafer sliced from a single crystal produced by employing a cooling rate of not less than 7.3° C./min in the temperature range of 1200–1050° C. in the step of pulling up thereof. According to the second manufacturing method, an epitaxial layer is allowed to grow on the surface of a silicon wafer sliced from a silicon single crystal doped with $1 \times 10^{12}$ atoms/cm$^3$ to $1 \times 10^{14}$ atoms/cm$^3$ as produced by employing a cooling rate of not less than 2.7° C./min in the temperature range of 1150–1020° C. and then a cooling rate of not more than 1.2° C./min in the temperature range of 1000–850° C. in the step of pulling up thereof.

5 Claims, 5 Drawing Sheets

METHOD OF MANUFACTURING EPITAXIAL WAFER AND METHOD OF PRODUCING SINGLE CRYSTAL AS MATERIAL THEREFOR

FIELD OF THE INVENTION

The present invention relates to a method of manufacturing a silicon single crystal, which is suited for use in the manufacture of a semiconductor integrated circuit device, by the Czochralski method and to a method of manufacturing an epitaxial wafer from the silicon crystal produced by that method. More particularly, it relates to a method of manufacturing an epitaxial wafer exhibiting high gettering capability while scarcely giving rise to stacking faults, dislocations and other defects in an epitaxial layer (hereinafter collectively referred to as "epitaxial layer defects") when it is grown on a wafer obtained from a silicon single crystal produced with or without doping with nitrogen, and to a method of producing such a single crystal to serve as a raw material for the epitaxial wafer.

DESCRIPTION OF THE PRIOR ART

With the recent increase in the integration density of silicon semiconductor devices, quality requirements imposed on silicon wafers on which devices are formed have become more and more severe. For example, severer limitations are imposed than ever on dislocations and like crystal defects and/or metal impurities in the so-called "device active region" where devices are formed, with the increasing fineness of circuits as resulting from the increase in integration density, since such defects and impurities increase the leakage current and shorten the life of a carrier.

In the art, wafers prepared by slicing silicon single crystals produced by the Czochralski method are used for forming semiconductor devices thereon. These wafers generally contain about $10^{18}$ atoms/cm$^3$ of supersaturation oxygen. Due to the thermal history in the steps of device formation, such oxygen forms oxide precipitate nuclei and thereby induces crystal defects such as dislocations and stacking faults. In the process of device manufacture, however, the so-called DZ layer (denuded zone) which is free of crystal defects and has a thickness of about tens of micrometers is formed near the wafer surface by diffusion of oxygen to the outside when the wafer is maintained at about 1100° C. for several hours in the step of field oxide film formation by LOCOS (local oxidation of silicon) or well diffusion layer formation. The DZ layer serves as a device active region, so that the occurrence of crystal defects is spontaneously prevented.

However, with the increase in the integration density of semiconductor devices, the high-energy ion implantation technique has been introduced for well formation by which the device process is carried out at a low temperature of 1000° C. or less. At such a temperature, the above-mentioned outward diffusion of oxygen does not occur to a sufficient extent, hence the DZ layer formation near the surface becomes insufficient. Therefore, attempts have been made to reduce the oxygen content in wafers, but such attempts have been unsuccessful in perfectly suppressing the formation of crystal defects.

Under such circumstances, epitaxial wafers having an epitaxial layer substantially free of crystal defects as formed therein have been developed and are now widely used in the manufacture of highly integrated devices. However, even epitaxial wafers high in crystallinity are used, the device characteristics are degraded due to contamination of the epitaxial layer with metal impurities in the subsequent device process steps.

The opportunity and influences of such contamination with impurity metal elements increase since the process becomes more complicated with the increase in the integration density. The contamination may be eliminated basically by cleaning the process environment and materials used. However, it is difficult to render the device process completely free of contaminants, hence the gettering technology becomes necessary as a measure for solving that problem. This is a means for entrapping contaminant impurity elements in a region (sink) other than the device active region to thereby render the contaminants harmless.

The gettering technology includes intrinsic gettering (hereinafter referred to as "IG" for short) which comprises entrapping impurity elements by utilizing oxygen-caused oxide precipitates spontaneously induced during heat treatment in the device process steps. However, when a wafer is heat-treated at a temperature as high as 1050–1200° C. in the epitaxial step, oxide precipitate nuclei occurring within the wafer sliced from a silicon single crystal shrink and vanish, whereby it becomes difficult to sufficiently induce oxide precipitates to serve as gettering sources within the wafer in the subsequent device process steps. Thus, even if the gettering technology is applied, a problem arises that any satisfactory IG effect cannot be exerted on metal impurities throughout the whole process.

To overcome such a problem, there is a proposal in the art that the wafer be heat-treated at 600–900° C. prior to the epitaxial step in the device manufacture to thereby allow oxide precipitate nuclei to grow to such a size that they hardly vanish even upon high temperature treatment in the epitaxial step (cf. e.g. Japanese Patent Application Laid-Open (Kokai) No. H08-339024).

Specifically, according to the proposal, oxide precipitate nuclei in the crystal are increased in size by heat treatment prior to device treatment to thereby increase the thermal stability thereof to a sufficient level. Even when the wafer is thereafter subjected to a high temperature heat treatment in the epitaxial step, the oxide precipitate nuclei will not shrink or vanish. The oxide precipitate nuclei that have survived the epitaxial step form oxide precipitates from the early stages of the device step and thus effectively serve as sinks for gettering, so that an excellent gettering effect can allegedly be expected. However, the proposed method has a problem in that the above heat treatment is required as a new process step in the silicon wafer manufacturing process and increases the cost of production of epitaxial wafers.

In addition to the above measure, methods of producing silicon single crystals have been proposed in the art which comprise doping the single crystals with nitrogen while they are grown by the Czochralski method, to thereby induce formation, within wafers, of oxide precipitate nuclei hardly vanishing even upon high temperature heat treatment in the epitaxial step (cf. e.g. Japanese Patent Application Laid-Open (Kokai) No. H11-189493 and Japanese Patent Application Laid-Open (Kokai) No. 2000-44389).

According to the methods proposed, a silicon single crystal having oxide precipitate nuclei which hardly shrink or vanish can be obtained even in the epitaxial step by increasing the thermal stability of oxide precipitate nuclei in the crystal by doping it with nitrogen while growing it by the Czochralski method. It is alleged that oxide precipitate nuclei remaining in wafers sliced from such single crystal after the epitaxial step form oxide precipitates from the early stages of the device step and thus effectively serve as sinks for gettering, so that the effects of IG can be expected from the early stages of the device step.

Later investigations, however, have revealed that high concentration nitrogen doping, for example doping with nitrogen at a concentration not lower than $1\times10^{14}$ atoms/cm$^3$ results in the formation of oxide precipitate nuclei, which are thermally stable and will not vanish even upon high temperature heat treatment in the epitaxial step, in the wafer inside and near the wafer surface as well and, therefore, in the epitaxial step, stacking faults, dislocations and the like occur in the epitaxial layer with the thermally stably oxide precipitate nuclei formed near the wafer surface serving as origins, readily inducing epitaxial defects. The epitaxial defects cause an increase in the leakage current and degradation in the gate oxide integrity, among others.

On the other hand, when nitrogen doping is effected at a low concentration, for example at $5\times10^{13}$ nitrogen atoms/cm$^3$ or below, the problem of epitaxial defects development is not encountered but the effect of nitrogen addition to increase the thermal stability of oxide precipitate nuclei is insufficient, so that even those oxide precipitate nuclei occurring inside the wafer disappear upon high temperature heat treatment in the epitaxial step, hence oxide precipitates are scarcely formed upon later high temperature heat treatment in the device step; the IG effect is thus low.

SUMMARY OF THE INVENTION

Accordingly, it is an object of the present invention in a first aspect thereof to provide a method of manufacturing epitaxial wafers by which the thermal stability of oxide precipitates is retained even after the epitaxial step without requiring any additional heat treatment step following silicon single crystal pulling up and thus epitaxial wafers capable of exhibiting high IG capability are provided.

Another object of the present invention, in a second aspect thereof, is to provide a method of manufacturing epitaxial wafers which solves the problem mentioned above concerning epitaxial defects resulting from doping with nitrogen and which provides epitaxial wafers allowing formation of a sufficient amount of oxide precipitates upon high temperature heat treatment in the device step while preventing the generation of epitaxial layer defects even when they are manufactured from a silicon single crystal grown with nitrogen doping.

The present invention, which has been completed from such viewpoints, is directed to a method of manufacturing epitaxial wafers in accordance with the first aspect thereof, a method of manufacturing epitaxial wafers in accordance with the second aspect thereof, and a method of producing silicon single crystals controlled with respect to the thermal history in the step of pulling up, as described below.

1. Method of Manufacturing Epitaxial Wafers in Accordance with the First Aspect of the Present Invention (Without Nitrogen Doping)

To investigate the influences of the rate of cooling in the step of silicon single crystal pulling up in the Czochralski method, namely the thermal history of the crystal on the thermal stability of oxide precipitate nuclei formed therein, the present inventors made experiments using silicon single crystals having a diameter of 4" and changing the rate of pulling up at an intermediate stage of the process.

The concrete method of experimentation was as follows. A cylindrical portion is formed to a length of 500 mm at a pulling rate of 1.0 mm/min and at the time of arrival at a length of 500 mm, the rate of pulling up is changed to 0.5 mm/min, 1.6 mm/min or 2.0 mm/min and the crystal is grown to a length of 550 mm. Thereafter, the rate of pulling up is again returned to 1.0 mm/min and the crystal is grown to 850 mm and then the pulling up is finished by tailing.

After the reduction in pulling rate, the thus-grown single crystal is cooled slowly from the temperature at the start of rate reduction to the lower temperature side by a temperature range of about 100° C. and, when the pulling rate is increased, it is rapidly cooled from the temperature at the start of rate increase to the lower temperature side by a temperature range of about 100° C. From that portion of each single crystal which has been cooled within the temperature range of 1400–600° C., samples are sliced and subjected to treatment at 1100° C.×16 hours (high temperature heat treatment). The thermal stability of oxide precipitates formed by pulling up by the Czochralski method is evaluated by counting the defects induced by the heat treatment.

FIG. 1 is a graphic representation of the relationship between the etch pit density after heat treatment in the experiments involving changes in rate of pulling up in the intermediate stage of the Czochralski method and the temperature at the start point of each changed rate. In FIG. 1, A crystal (slow cooling) corresponds to the case where the pulling rate was changed from 1.0 mm/min to 0.5 mm/min, B crystal (rapid cooling) to the case where it was changed from 1.0 mm/min to 1.6 mm/min, and C crystal (rapid cooling) to the case where it was changed from 1.0 mm/min to 2.0 mm/min.

From the results shown in FIG. 1, it is evident that rapid cooling in the temperature range of 1200° C. to 1050° C. results in marked increases in the etch pit density after heat treatment, namely in the density of oxide precipitates. Comparison between B crystal and C crystal reveals an increased defect density in C crystal cooled more rapidly. It is also seen that slow cooling in the temperature range of 1000° C. to 700° C. also results in stable increases in the oxide precipitate density.

The present invention, which has been completed based on the findings obtained in the above-mentioned pulling rate changing experiments by the Czochralski method, is directed to a method of manufacturing epitaxial wafers from a silicon single crystal pulled up by the Czochralski method while controlling the thermal history thereof. More particularly, the present invention includes (1) the first and (2) the second method of producing silicon single crystals as mentioned below and to the method of manufacturing epitaxial wafers which uses silicon wafers sliced from such single crystals, as mentioned below.

(1) The First Single Crystal and the Manufacture of Epitaxial Wafers Using the Same The first single crystal is produced by selecting a cooling rate of not less than 7.3° C./min within the temperature range of 1200–1050° C. in crystal pulling up in the Czochralski method and the method of manufacturing epitaxial wafers according to the present invention is characterized in that an epitaxial layer is grown on the surface of silicon wafers sliced from that single crystal.

The reason why the temperature range of 1200–1050° C. is selected for such cooling in pulling up the first single crystal is that, as is evident from the above-mentioned results shown in FIG. 1, rapid cooling in this temperature range can result in an increased etch pit density after heat treatment and thus in an increased density of oxide precipitates. As a result, an excellent IG effect can be produced.

Further, rapid cooling, namely a cooling rate of not less than 7.3° C./min, is required since this is the cooling rate giving B crystal as evidenced by the pulling rate changing test mentioned above. It has been established that such cooling rate can produce sufficient cooling effects. Furthermore, it is desirable that rapid cooling be carried out at a cooling rate of not less than 8.5° C./min, which gives C crystal.

By rapidly cooling at a rate of not less than 7.3° C./min within the temperature range of 1200–1050° C. during the first single crystal pulling up, vacancies introduced at the solid-liquid interface can be prevented from aggregation or cohesion and thus the density of residual vacancies can be maintained at a high level. As a result, the free energy for the formation of oxide precipitate nuclei decreases and the growth of oxide precipitate nuclei starts within a higher temperature range than in the prior art. Therefore, the thermal stability of oxide precipitate nuclei themselves increases and, thus, a sufficient number of oxide precipitates can be formed even in the heat treatment in the device process following epitaxial growth.

Therefore, according to the method of manufacturing epitaxial wafers which uses the first single crystal, the effects of IG can fully be produced from early stages of the device step by causing an epitaxial layer on the surface of silicon wafers sliced from the silicon single crystal produced by controlling the thermal history thereof, as mentioned above, without any additional heat treatment step prior to the epitaxial step.

(2) The Second Single Crystal and the Method of Manufacturing Epitaxial Wafers Using the Same The second single crystal is a silicon single crystal produced by the Czochralski method by selecting a cooling rate of not less than 7.3° C./min in the temperature range of 1200–1050° C. in the step of pulling up and a cooling rate of not more than 3.5° C./min in the temperature range of 1000–700° C. The method of manufacturing epitaxial wafers according to the present invention is characterized in that an epitaxial layer is grown on the surface of silicon wafers sliced from that single crystal.

The rapid cooling in the temperature range of 1200–1050° C. in the first stage of the cooling step to be controlled in pulling up the second single crystal produces the same effects as the cooling of the first single crystal. Further, the subsequent slow cooling in the temperature range of 1000–700° C. in the next stage is based on the finding from the results shown in FIG. 1 that the oxide precipitate nuclei formed can be grown and rendered more thermally stable by such slow cooling.

Within the temperature range of 1000–700° C., a slow rate of cooling of not more than 3.5° C./min is employed, as mentioned above, since as indicated by the results of the pulling rate changing test mentioned above, such cooling rate produces sufficient effects of slow cooling to stably increase the density of oxide precipitates.

Even in the method of manufacturing epitaxial wafers which uses the second single crystal, when an epitaxial layer is grown on the surface of silicon wafers sliced from the silicon single crystal produced by controlling the thermal history in the manner mentioned above, the oxide precipitate nuclei will not shrink or vanish upon epitaxial treatment without needing any additional heat treatment step, like in the production method which uses the first single crystal.

It is desirable that the oxygen content in the silicon wafers sliced from the first or second single crystal be not less than $12 \times 10^{17}$ atoms/cm$^3$ (ASTM '79). Silicon single crystals produced by the Czochralski method generally contain about $10^{18}$ atoms/cm$^3$ of supersaturation oxygen but, when the oxygen content is insufficient, a marked decrease in wafer strength may result and/or sufficient IG effects will not be produced in certain instances. Therefore, it is desirable that the oxygen concentration be not less than $12 \times 10^{17}$ atoms/cm$^3$ (ASTM '79) so that the stability of oxide precipitate nuclei can be effectively secured when the first or second single crystal is used.

2. The Second Method of Manufacturing Epitaxial Wafers (with Nitrogen Doping)

The present inventors then carried out experiments in which the pulling rate was changed in the intermediate stage in the Czochralski method using silicon single crystals having a diameter of 6" to investigate the influences of the thermal history of the crystal on the thermal stability of oxide precipitate nuclei formed in the single crystal doped with nitrogen.

To be concrete, the experiments were carried out as follows. A cylindrical portion is grown to a length of 500 mm at a pulling rate of 0.7 mm/min and, after attaining the length of 500 mm, the pulling rate is slowed down to 0.2 mm/min or increased to 1.2 mm/min, followed by growing to a length of 550 mm. Thereafter the pulling rate is returned to 0.7 mm/min and, after growing to 850 mm, the pulling up procedure is finished by tailing. The dopant nitrogen concentration in the single crystal is adjusted to $1 \times 10^{13}$ atoms/cm$^3$.

The single crystal thus grown is cooled slowly or rapidly according to the change in pulling rate, as mentioned above. After pulling up, samples are sliced from that portion cooled within the temperature range of 1400–800° C., subjected to high temperature heat treatment, namely treatment at 1100° C. for 16 hours and examined for the number of heat treatment-induced defects, and the thermal stability of oxide precipitates formed during pulling up by the Czochralski method is evaluated in terms of the oxide precipitate density.

FIG. 2 is a graphic representation of the relationship between the etch pit density after heat treatment and the temperature at the start of pulling rate changing as revealed by the experiments involving pulling rate changing in the intermediate stage of the Czochralski method. From the results shown in FIG. 2, it is evident that rapid cooling in the temperature range of 1150–1020° C. results in an increased etch pit density after heat treatment and in an increased density of oxide precipitates. It is also evident that slow cooling in the temperature range of 1000–850° C. also results in a stable increase in oxide precipitate density.

The inventors further carried out experiments involving detaching and rapid cooling in the Czochralski method to find out the temperature range in which vacancies, which are void-type defects, and oxide precipitate nuclei are formed during the growth of nitrogen-doped single crystals. Concretely, after formation of a predetermined length of a cylindrical portion, the pulling up is discontinued for a predetermined period and, thereafter, the single crystal is detached from the melt and examined for the density of defects (cf. Japanese Patent Application Laid-Open (Kokai) No. H10-236897, if necessary).

In the above experiments, silicon single crystals having a diameter of 6" are grown with doping with nitrogen in a concentration of $1 \times 10^{14}$ atoms/cm$^3$ to thereby render the defect forming temperature for crystal growth conspicuous. The experimental conditions were as follows. In the step of cylindrical portion growth at a pulling rate of 1.0 mm/min, the crystal growth is discontinued for 5 hours and then the crystal is detached from the melt surface and processed for lengthwise division in the direction of single crystal puling up, and the density of void defects generated is determined. Void defects are detected using a Bio-Rad defect detector OPP (optical precipitate profiler) and the density thereof is evaluated.

FIG. 3 is a graphic representation of the relationship between the OPP defect density and the crystal detachment temperature as revealed in the detaching and rapid cooling experiments by the Czochralski method. The results shown in FIG. 3 indicate that the temperature range in which void defects are readily formed is 1100–1020° C. For the case of no nitrogen addition, it is reported in the art that the void defect forming temperature range is 1100–1070° C. (H. Nishikawa, T. Tanaka, Y. Yanase, M. Hourai, M. Sanno and H. Tsuya, Jpn. J. Appl. Phys. Vol. 36 (1997), p. 6595). The above results, however, show that when doping is carried out with nitrogen, the defect formation temperature range widens to the lower temperature side by about 50° C. Thus, it is indicated that the diffusion of vacancies is inhibited by the addition of nitrogen and the degree of supersaturation of vacancies is still high even at below 1070° C. and, as a result, void defects are formed.

Then, to reveal the oxide precipitate nuclei formation temperature, samples obtained from the detaching rapid cooling experiments were subjected to constant temperature heat treatment at 1050° C. for 4 hours and then etched, and the density of such nuclei was determined.

FIG. 4 is a graphic representation of the relationship between the etch pit density and the temperature at detachment as revealed in the detaching rapid cooling experiments by the Czochralski method. From the results shown in FIG. 4, it is evident that etch pits are observable at detachment temperatures not higher than 1050° C. They are particularly outstanding when the detachment temperature is within the range of 1050–800° C. This fact indicates that stable oxide precipitate nuclei are formed in the temperature range of not higher than 1050° C. during the process of cooling for crystal growth.

While, in the art, it has so far been considered that, for nitrogen-free crystals, the formation of oxide precipitate nuclei is observed in the detachment temperature range of 900° C. and below, the above results indicate that the addition of nitrogen raises the temperature range in which oxide precipitate nuclei are formed. This is due to the fact that the number of residual vacancies increases under the influence of nitrogen addition and the free energy for the formation of oxide precipitate nuclei lowers and, as a result, the formation of oxide precipitate nuclei in the higher temperature range becomes possible.

The second epitaxial wafer manufacturing method of the present invention has been completed based on the above findings obtained in the pulling rate changing experiments and detaching and rapid cooling experiments by the Czochralski method. In particular, the present invention has been completed based on the finding that there is an appropriate rate of cooling according to the dopant nitrogen concentration at which rate single crystals high in oxide precipitate density can be produced. More specifically, the present invention is directed to methods of producing (1) the third to (4) sixth single crystals mentioned below and to methods of manufacturing epitaxial wafers using silicon wafers sliced from the respective single crystals.

(1) The Third Single Crystal and the Production of Epitaxial Wafers Using the Same The method of producing the third single crystal is characterized in that, in pulling up a silicon single crystal doped with $1 \times 10^{12}$ atoms/cm$^3$ to $1 \times 10^{14}$ atoms/cm$^3$ of nitrogen in the Czochralski method, a cooling rate of not less than 2.7° C./min is employed in the single crystal temperature range of 1150–1020° C.

In the third single crystal, the dopant nitrogen concentration is restricted to $1 \times 10^{12}$ atoms/cm$^3$ to $1 \times 10^{14}$ atoms/cm$^3$ because the effect of thermally stabilizing oxide precipitate nuclei is low, hence those oxide precipitate nuclei which occur within the wafer inside disappear upon high temperature heat treatment in the epitaxial step, when the nitrogen concentration is lower than $1 \times 10^{12}$ atoms/cm$^3$, while when the concentration is higher than $1 \times 10^{14}$ atoms/cm$^3$, the effect of thermally stabilizing oxide precipitate nuclei is conversely excessive, hence those oxide precipitate nuclei having high thermal stability and occurring in the vicinity of the wafer surface will not vanish even when subjected to high temperature heat treatment in the epitaxial step but rather cause generation of epitaxial layer defects.

The temperature range for the above cooling is restricted to 1150–1020° C. since, as is evident from the results shown in FIG. 2, the etch pit density after heat treatment can increase and the oxide precipitate density can increase accordingly when rapid cooling is carried out in that temperature range. Further, the rate of cooling is restricted to 2.7° C./min or more since this is a cooling rate found securable and appropriate in the above pulling rate changing test mentioned above; it has been confirmed that sufficient cooling effects can be produced at such a rate.

Thus, in the method of producing the third single crystal, the nitrogen concentration is restricted to a relatively low level within the range of $1 \times 10^{12}$ atoms/cm$^3$ to $1 \times 10^{14}$ atoms/cm$^3$ to thereby suppress the formation of thermally stable oxide precipitate nuclei and, on the other hand, the single crystal is rapidly cooled in the temperature range of 1150–1020° C. to thereby prevent vacancies incorporated at the solid-liquid interface from cohesion and cause the formation of oxide precipitate nuclei on the higher temperature side and thus allow oxide precipitate nuclei to grow. By this, it is possible to prevent epitaxial layer defects from being generated and attain sufficient oxide precipitate formation even in the heat treatment after epitaxial growth.

In accordance with the second epitaxial wafer manufacturing method, an epitaxial layer is grown on the surface of silicon wafers sliced from the third silicon single crystal. By this, it is possible to manufacture epitaxial wafers high in IG capability with scarce occurrence of epitaxial layer defects. In other words, it is possible to manufacture high-quality epitaxial wafers free of defects in the device active region.

(2) The Fourth Single Crystal and the Method of Manufacturing Epitaxial Wafers Using the Same The method of producing the fourth single crystal is characterized in that, in pulling up the silicon single crystal doped with $1 \times 10^{12}$ atoms/cm$^3$ to $1 \times 10^{14}$ atoms/cm$^3$ in the Czochralski method, a cooling rate of not more than 1.2° C./min is employed in the single crystal temperature range of 1000–850° C.

Here, slow cooling is employed in the temperature range of 1000–850° C. because, as is evident from the results shown in FIG. 2, the growth of oxide precipitate nuclei can be promoted even by slow cooling in that temperature range and thereby oxide precipitate nuclei relatively large in size can be formed. Based on the results of the above-mentioned pulling rate changing test, a slow cooling rate of not more than 1.2° C./min is employed as the cooling rate in the above restricted temperature range; sufficient oxide precipitate nuclei growth can be attained at such a cooling rate.

In accordance with the second epitaxial wafer manufacturing method, an epitaxial layer is grown on the surface of silicon wafers sliced from the fourth silicon single crystal, whereby epitaxial wafers exhibiting high IG capability can be manufactured with scarce occurrence of epitaxial layer defects.

(3) The Fifth Single Crystal and the Method of Manufacturing Epitaxial Wafers Using the Same The method of producing the fifth single crystal is characterized in that, in pulling up the silicon single crystal doped with $1 \times 10^{12}$ atoms/cm$^3$ to $1 \times 10^{14}$ atoms/cm$^3$ of nitrogen in the Czochralski method, a cooling rate of not less than 2.7° C./min is employed in the single crystal temperature range of 1150–1020° C. and, thereafter, a cooling rate of not more than 1.2° C./min is employed in the temperature range of 1000–850° C.

The fifth single crystal can be produced by combining the method of producing the third single crystal with the method of producing the fourth single crystal.

In accordance with the second epitaxial wafer manufacturing method, an epitaxial layer is grown on the surface of silicon wafers sliced from the fifth silicon single crystal, whereby epitaxial wafers exhibiting high IG effects can be produced with scarce occurrence of epitaxial defects, as in the case where the third or fourth single crystal is used.

(4) The Sixth Single Crystal and the Method of Manufacturing Epitaxial Wafers Using the Same The method of producing the sixth single crystal is characterized in that, in pulling up the silicon single crystal doped with $5 \times 10^{13}$ atoms/cm$^3$ to $1 \times 10^{16}$ atoms/cm$^3$ of nitrogen in the Czochralski method, a cooling rate of not less than 6.5° C./min is employed in the single crystal temperature range of 1150–800° C.

From the viewpoint of preventing epitaxial layer defects from occurring, it is effective to select a low nitrogen concentration, as mentioned hereinabove. However, an increased nitrogen concentration thermally stabilizes those oxide precipitate nuclei which occur within the wafer and prevents them from vanishing upon high temperature heat treatment to thereby contribute toward the increase in oxide precipitate density, hence it is effective to utilize such increased nitrogen concentration.

The present inventors conjectured that even thermally stable oxide precipitate nuclei occurring near the wafer surface, if not large in size, would vanish upon high temperature heat treatment for epitaxial growth and have now arrived at the method of producing the sixth single crystal.

For the sixth single crystal, a relatively high nitrogen concentration is selected within the dopant nitrogen concentration range of $5 \times 10^{13}$ atoms/cm$^3$ to $1 \times 10^{16}$ atoms/cm$^3$ to cause the formation of thermally stable oxide precipitate nuclei. And, by rapidly cooling at a rate of not less than 6.5° C./min in the temperature range of 1150–800° C., namely by cooling as rapidly as possible in the temperature range of 1150–800° C., which corresponds to the temperature range in which void defects are formed (cf. FIG. 3) and the temperature range in which oxide precipitate nuclei are grown (cf. FIG. 4), it is intended that the formation of void defects be supposedly causative of epitaxial defects and the growth of thermally stable oxide precipitate nuclei be both prevented.

The upper limit to the nitrogen concentration for doping the sixth single crystal is set at $1 \times 10^{16}$ atoms/cm$^3$ because, at a level exceeding this limit, single crystals have dislocations in single crystal growing and the product yield thus markedly decreases. The lower limit to the cooling rate is 6.5° C./min (rapid cooling) since, at a lower rate, the effect of preventing voids from cohesion is slight and the effect of suppressing the growth of oxide precipitate nuclei is also slight due to the high dopant nitrogen concentration, with the result that thermally stable oxide precipitate nuclei large in size are formed.

In accordance with the second epitaxial wafer manufacturing method, an epitaxial layer is grown on the surface of silicon wafers sliced from the sixth silicon single crystal, whereby epitaxial wafers exhibiting high IG capability can be manufactured with scarce occurrence of epitaxial layer defects, as in the case where one of the third to fifth single crystals is used. In other words, it is possible to manufacture high-quality epitaxial wafers free of defects in the device active region.

In the second epitaxial wafer manufacturing method, it is desirable that the oxygen content in the above-mentioned third to sixth single crystals be not less than $4 \times 10^{17}$ atoms/cm$^3$ (ASTM '79) so that a sufficient amount of oxide precipitates to produce sufficient IG effects can be secured. The reason is that while the silicon single crystals produced by the Czochralski method generally contain about $10^{18}$ atoms/cm$^3$ of supersaturation oxygen, as mentioned above, an insufficient oxygen concentration results in decreases in wafer strength and/or failure to produce satisfactory IG effects.

The method of doping to be employed in the second epitaxial wafer manufacturing method may be any one provided that doping with a predetermined concentration of nitrogen can be realized. Thus, for example, there may be mentioned the method which comprises incorporating a nitride into the raw material or melt, incorporating a nitrogen-added silicon crystal by the floating zone (FZ) technique or a wafer having a silicon nitride film on the surface into the wafer material, growing single crystals while passing nitrogen gas or a nitrogen compound gas through the furnace, blowing nitrogen or a nitrogen compound gas against polycrystalline silicon at high temperatures prior to melting, or using a nitride-made crucible.

DESCRIPTION OF PREFERRED EMBODIMENTS

In accordance with the first epitaxial wafer manufacturing method (without nitrogen doping) or the second epitaxial wafer manufacturing method (with nitrogen doping) of the present invention, it is specified that a specific cooling rate should be selected within a specific temperature range with regard to the thermal history of a silicon single crystal to be pulled up in the Czochralski method. There are various methods for providing silicon single crystals with such thermal history in pulling up the same in the Czochralski method. For example, this becomes possible by optimizing the heat shield material to be used in a production apparatus for carrying out the Czochralski method.

Figure 5:
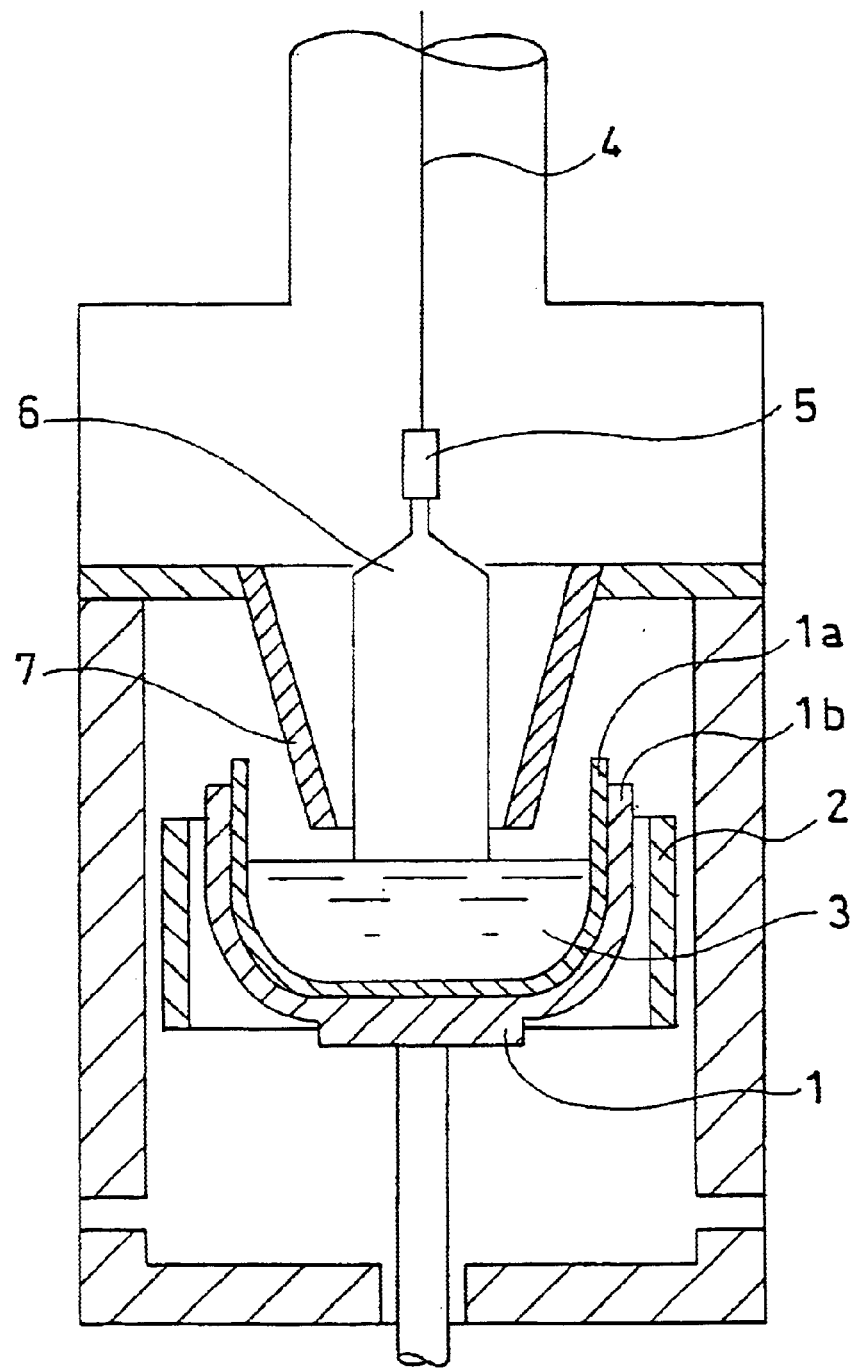
FIG. 5 is a schematic representation of an apparatus used in the practice of the present invention for producing silicon single crystals by the Czochralski method.

FIG. 5 illustrates the constitution of an apparatus for producing silicon single crystals by the Czochralski method in accordance with the present invention. In the central position of the apparatus, there is disposed a crucible 1, which is composed of a quartz container 1a and a graphite container 1b closely surrounding the container 1a. A cylindrical heater 2 is disposed coaxially surrounding the crucible 1, and a melt 3 resulting from melting by that heater is contained in the crucible 1. Above the crucible 1, there is disposed a pulling shaft 4 with a seed crystal 5 mounted thereon in the manner capable of ascending and descending. A single crystal 6 is allowed to grow at and from the lower end of the seed crystal 5. A heat shield 7 is disposed surrounding the growing single crystal 6.

Figure 6:
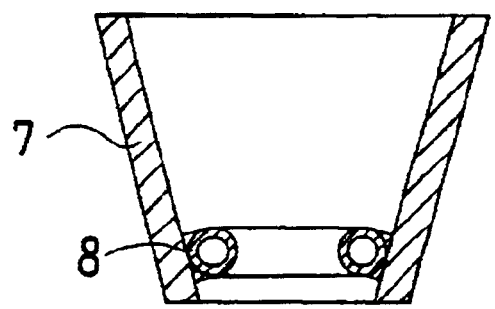
FIG. 6 is a representation of an example of optimization of the heat shield for use in the first epitaxial wafer manufacturing method.

FIG. 6 is a representation of an example of optimization of the heat shield for use in carrying out the first epitaxial wafer manufacturing method. In producing the first single crystal mentioned above, rapid cooling is to be effected within the temperature range of 1200–1050° C. To enable such cooling, as shown in FIG. 6, a cooling tube 8 is integrated in the heat shield 7. By circulating a cooling medium through the tube, the single crystal pulled up can be rapidly cooled within the temperature range of 1200–1050° C.

Figure 7:
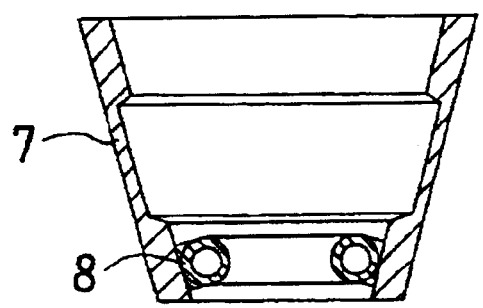
FIG. 7 is a representation of another example of optimization of the heat shield for use in the same epitaxial wafer manufacturing method.

FIG. 7 is a representation of another example of optimization of the heat shield for use in the first epitaxial wafer manufacturing method. In the method of producing the second single crystal mentioned above, slow cooling is carried out in the temperature range of 1000–700° C. in addition to the requirement posed on the first single crystal. As shown in FIG. 7, the cooling rate in the temperature range of 1200–1050° C. is increased by integrating the cooling tube 8 in the heat shield 7 and circulating a cooling medium therethrough and, further, the thickness of the insulating material of the heat shield 7 is partially reduced to thereby increase the level of heat radiation from the heater 2 while the cooling rate in the silicon single crystal temperature range of 1000–700° C. is reduced. By selecting an optimized heat shield construction in that manner, it is possible to increase the cooling rate to 7.3° C./min or more in the temperature range of 1200–1050° C. and decrease the cooling rate in the temperature range of 1000–700° C. to 3.5° C./min or less.

Figure 1:
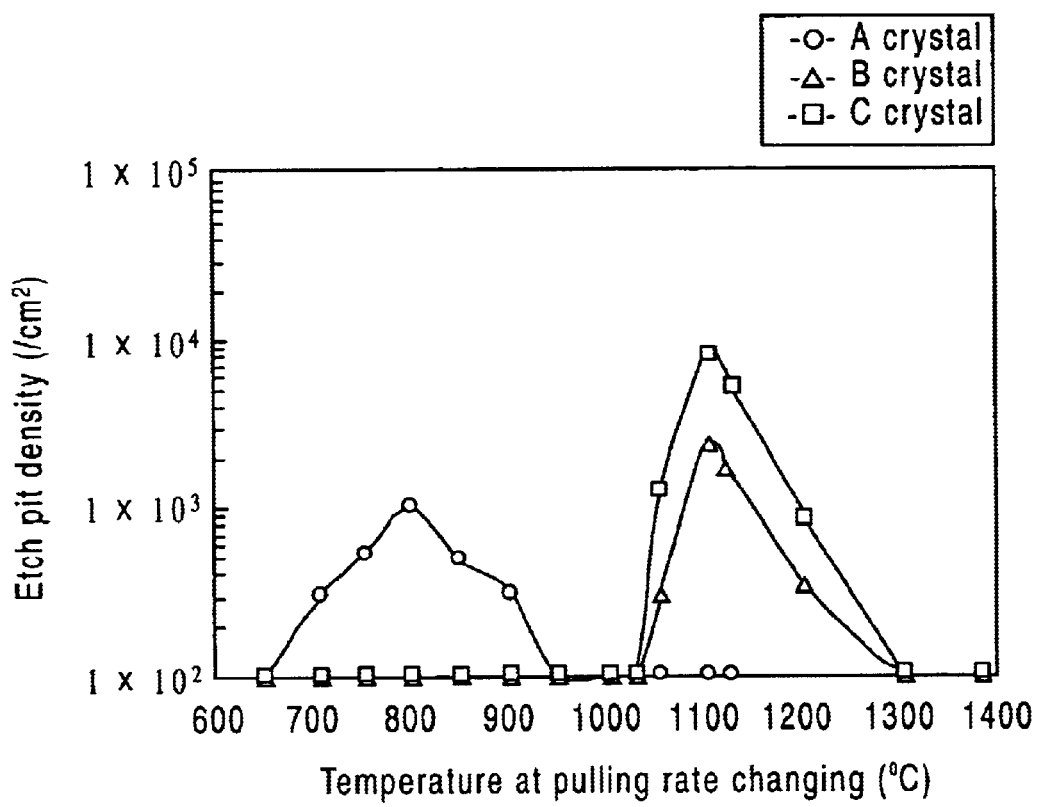
FIG. 1 is a graphic representation of the relationship between the etch pit density after heat treatment and the temperature at the start of pulling rate changing as found by the experiments by the Czochralski method in which the pulling rate was changed in the intermediate stage and which was made to examine the possible influences of the thermal history in the first epitaxial wafer manufacturing method.
Figure 2:
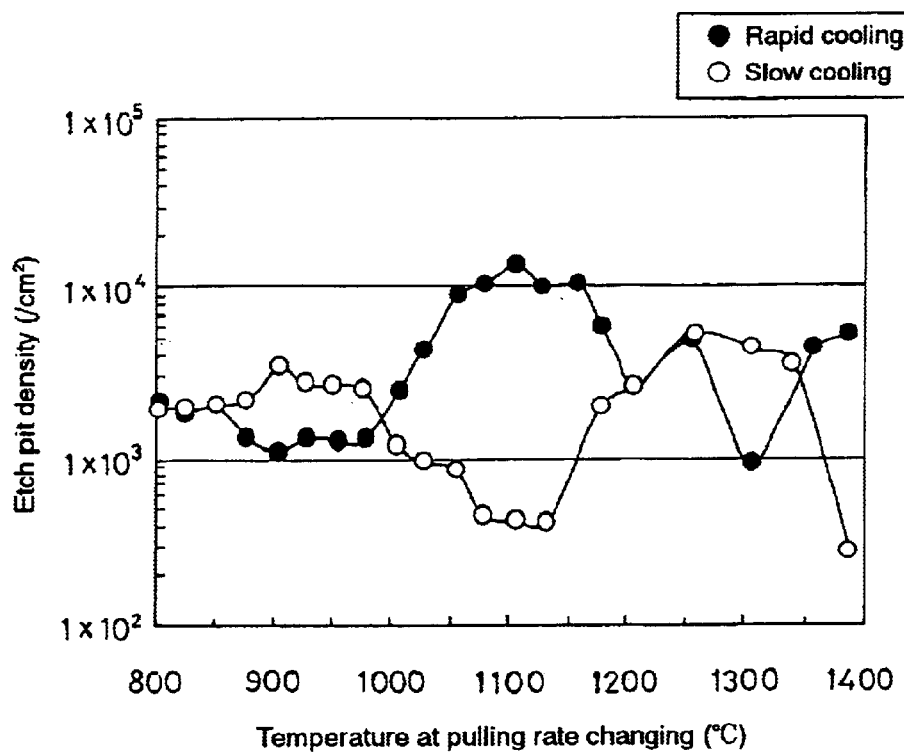
FIG. 2 is a graphic representation of the relationship between the etch pit density after heat treatment and the temperature at the start of pulling rate changing as found by the experiments by the Czochralski method in which the pulling rate was changed in the intermediate stage and which was made to examine the possible influences of the thermal history in the second epitaxial wafer manufacturing method.
Figure 3:
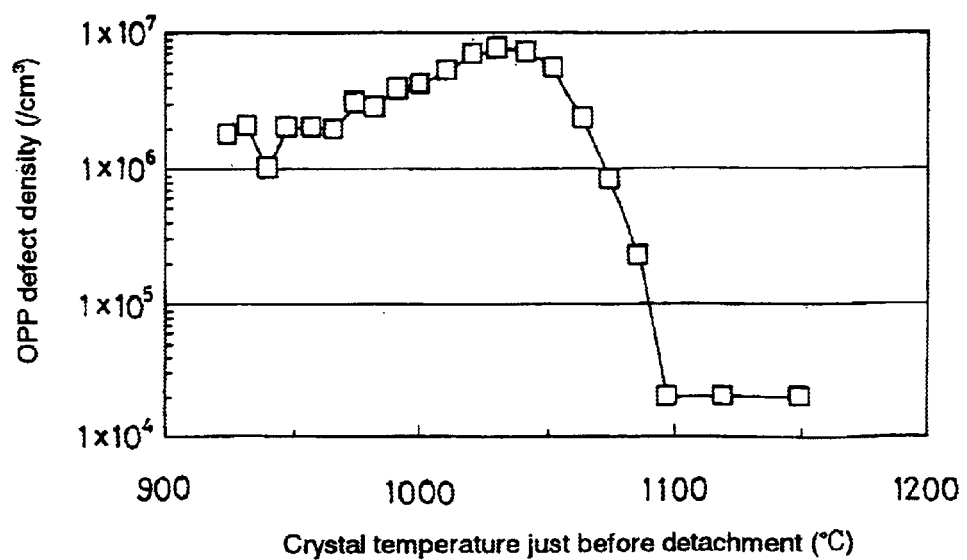
FIG. 3 is a graphic representation of the relationship between the OPP defect density and the crystal temperature just before detachment as found in the detaching and rapid cooling experiments by the Czochralski method.
Figure 4:
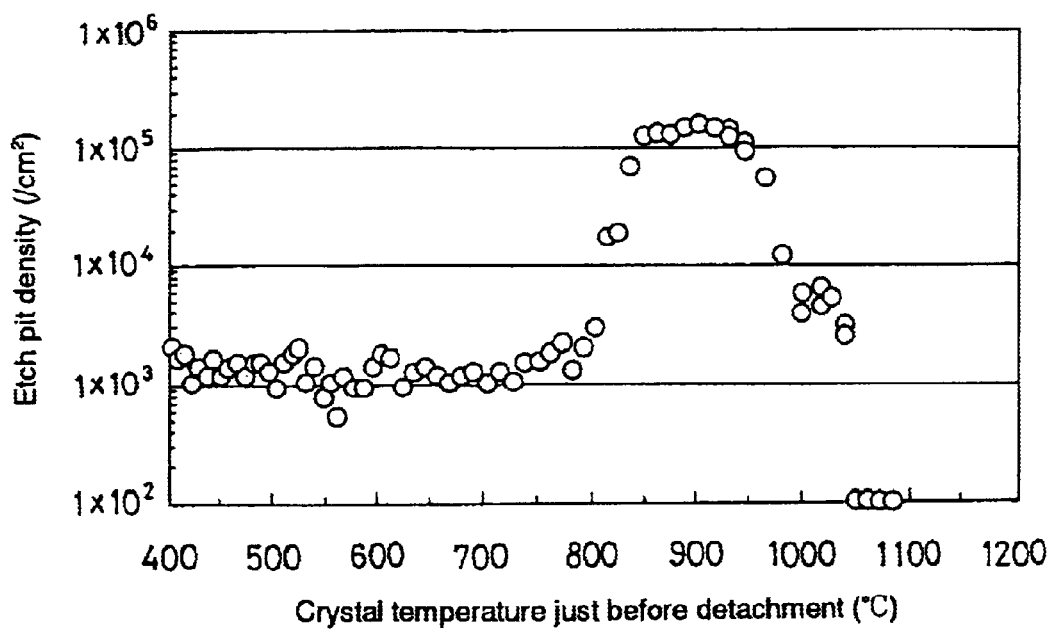
FIG. 4 is a graphic representation of the relationship between the etch pit density and the crystal temperature just before detachment as found in the detaching and rapid cooling experiments by the Czochralski method.
Figure 8:
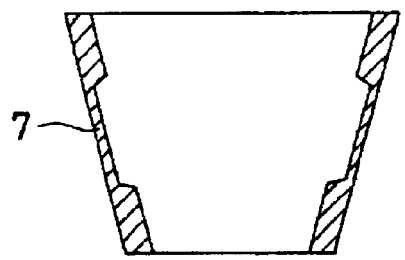
FIG. 8 is a representation of an example of optimization of the heat shield for use in the second epitaxial wafer manufacturing method.

FIG. 8 is an example of optimization of the heat shield for use in the second epitaxial wafer manufacturing method. As shown in FIG. 8, the thickness of the insulating material of the heat shield 7 is partially reduced so that the level of heat radiation from the heater 2 can be increased in pulling up the fourth or fifth single crystal mentioned above; while the silicon single crystal can be slowly cooled in the temperature range of 1000–850° C.

In the first epitaxial wafer manufacturing method of the present invention, wafers are sliced from the silicon single crystal the thermal history of which has been controlled in the step of pulling up in the Czochralski method, the surface thereof is abraded or polished and washed and, then, an epitaxial layer is formed thereon. In the second epitaxial wafer manufacturing method, the nitrogen-doped silicon single crystal the heat history of which has been controlled in the step of pulling up in the Czochralski method is sliced, the surface of slices is abraded or polished and washed and, then, an epitaxial layer is formed thereon. In growing the epitaxial layer, any of the methods known for forming crystal defect-free epitaxial layers can be applied to the surface of wafers sliced from the above-mentioned single crystal, for example the vapor phase growth or thermal decomposition method.

EXAMPLES

1. The First Epitaxial Wafer Manufacture

For confirming the effects of the first epitaxial wafer manufacturing method according to the present invention, tests were carried out as described below in Examples 1 to 3.

1-1 Example 1

Example 1 is a comparative example in which the conditions specified for the first epitaxial wafer manufacturing method are not satisfied. A p-type (100) silicon single crystal having a diameter of 8 inches was produced using the production apparatus shown in FIG. 5. As for the pulling conditions, the cooling rate in the temperature range of 1200–1050° C. was 2.5° C./min and then, in the temperature range of 1000–700° C., the cooling rate was 1.2° C./min. The initial oxygen concentration was $13.9 \times 10^{17}$ atoms/cm$^3$ (ASTM '79).

Wafers were sliced from the single crystal produced and, after surface polishing and washing, an epitaxial layer was allowed to grow thereon at a deposition temperature of 1150° C. to give sample 1 wafers. Then, these wafers were heat-treated at 1000° C. for 16 hours and then cleaved, each cleaved surface was subjected to 5 minutes of selective etching using Wright's etching solution and then counted for etch pit density, and the bulk micro-defects after heat treatment formed in the wafer was determined. The results of such measurements are shown in Table 1.

TABLE 1

|  | Sample | Cooling rate 1200–1050° C. (° C./min) | Cooling rate 1000–700° C. (° C./min) | Initial oxygen content (atoms/cm$^3$) | Etch pit density (/cm$^2$) |
|---|---|---|---|---|---|
| Example 1 | Sample 1 | *25° C./min | 1.2° C./min | $13.9 \times 10^{17}$ | $<1 \times 10^2$ |
| Example 2 | Sample 2 | 8.2° C./min | 5.2° C./min | $10.2 \times 10^{17}$ | $6.8 \times 10^3$ |
|  | Sample 3 | 7.4° C./min | 5.6° C./min | $12.5 \times 10^{17}$ | $2.8 \times 10^4$ |
| Example 3 | Sample 4 | 8.2° C./min | 3.2° C./min | $9.7 \times 10^{17}$ | $1.5 \times 10^4$ |
|  | Sample 5 | 9.2° C./min | 3.4° C./min | $13.2 \times 10^{17}$ | $5.4 \times 10^4$ |

Note) In the table, the symbol * indicates that the condition marked is outside the range specified by the present invention.

With Sample 1, almost no oxide precipitates were observed since the cooling rate within the temperature range of 1200–1050° C. was 2.5° C./min, hence outside the range specified by the present invention. The etch pit density did not arrive at the detection limit under an optical microscope ($<1 \times 10^2$).

1-2 Example 2

In Example 2, for confirming the effects producible by the use of the first single crystal, p-type (100) silicon single crystals having a diameter of 8 inches were produced using a single crystal producing apparatus in which the heat shield shown in FIG. 6 was used. The cooling rate in the temperature range of 1200–1050° C. and the cooling rate in the temperature range of 1000–700° C. in the process of pulling were as shown in Table 1. Two levels of initial oxygen content in crystal were employed, namely a low oxygen level (Sample 2) and a high oxygen level (Sample 3). The oxygen contents and cooling rates employed in this example are shown in Table 1.

Wafers were sliced from the single crystals produced and, after surface polishing and washing, an epitaxial layer was allowed to grow at a deposition temperature of 1150° C. and, for each wafer, the etch pit density after heat treatment was determined in the same manner as in Example 1. The results of these measurements are shown in Table 1.

As compared with Sample 1 in Example 1, sufficient defect densities could be obtained in Samples 2 and 3. Further, comparison between Samples 2 and 3 revealed that Sample 3 for which the initial oxygen content was $12 \times 10^{17}$ atoms/cm$^3$ (ASTM '79) had an etch pit density after heat treatment of $2.8 \times 10^4$/cm$^2$, indicating the formation of more stable oxide precipitates therein.

1-3 Example 3

In Example 3, p-type (100) silicon single crystals having a diameter of 8 inches were produced using a single crystal producing apparatus in which the heat shield shown in FIG. 7 was used, for confirming the effects of the use of the second single crystal. The cooling rate in the temperature range of 1200–1050° C. and the cooling rate in the temperature range of 1000–700° C. in the process of pulling up were as shown in Table 1, and two levels of initial oxygen concentration in crystal, namely a low oxygen level (Sample 4) and a high oxygen level (Sample 5), employed. The oxygen contents and cooling rates in this example are shown in Table 1.

Wafers were sliced from the single crystals produced and, after surface polishing and washing, an epitaxial layer was allowed to grow at a deposition temperature of 1150° C., and, for each wafer, the etch pit density after heat treatment was determined in the same manner as in Example 1. The results of these measurements are shown in Table 1.

In Samples 4 and 5 of the second method, the etch pit density after heat treatment could be increased, except for the influence of the initial oxygen content, as compared with Samples 2 and 3 of the first method. Further, comparison between Samples 4 and 5 revealed that Sample 5 for which the initial oxygen content was not lower than $12 \times 10^{17}$ atms/cm$^3$ (ASTM '79) had an etch pit density after heat treatment of $5.4 \times 10^4$/cm$^2$, indicating the formation of stable oxide precipitates and the production of sufficient IG effects.

As mentioned above, according to the first epitaxial wafer manufacturing method of the present invention, no additional heat treatment process step is required after silicon single crystal pulling up, and it is possible to attain the thermal stability of oxide precipitate even after the epitaxial step and thus produce epitaxial wafers capable of exhibiting high IG effects.

For each of the samples in Examples 1 to 3, the density of epitaxial layer defects was measured using a surface defect measuring apparatus. For all the samples, it was not more than 0.05/cm$^2$.

2. The Second Epitaxial Wafer Manufacture

For confirming the effects of the second epitaxial wafer manufacturing method of the present invention, the tests mentioned below in Examples 4 to 6 were carried out.

2-1 Example 4

In Example 4, for confirming the effects of the use of the third single crystal, p-type (100) silicon single crystals (initial oxygen content: $1 \times 10^{18}$ atoms/cm$^3$ (ASTM '79)) having a diameter of 8 inches were produced. In effecting cooling in the temperature range of 1150–1020° C. in the process of pulling up, the rate of pulling up was controlled within the range of 0.7 mm/min to 2.0 mm/min and the dopant nitrogen concentration was also varied, and the single crystals were produced. The nitrogen contents and cooling rates on that occasion are shown in Table 2.

Wafers were sliced from the single crystals produced and, after surface polishing and washing, an epitaxial layer was allowed to grow on each wafer at a deposition temperature of 1150° C., and the density of epitaxial layer defects was measured using a commercial surface defect measuring apparatus. Then, these wafers were heat-treated at 1000° C. for 16 hours and then cleaved and each cleavage surface was selectively etched with Wright's etching solution for 5 minutes, the etch pit density was counted under an optical microscope, and the etch pit density after heat treatment formed in each wafer was determined. The results of these measurements are shown in Table 2.

TABLE 2

| Sample | Nitrogen Content (atoms/cm$^3$) | Cooling rate 1150–1020° C. (° C./min) | Etch pit density (/cm$^2$) | Epitaxial layer defect density (defects/cm$^2$) |
|---|---|---|---|---|
| Sample 1 | $1.3 \times 10^{14}$ | *2.81 | $8.7 \times 10^4$ | 1.85 |
| Sample 2 | $4 \times 10^{12}$ | *1.98 | $2.1 \times 10^3$ | 0.04 |
| Sample 3 | $4 \times 10^{12}$ | 2.88 | $8.5 \times 10^3$ | 0.03 |
| Sample 4 | $4 \times 10^{12}$ | 4.30 | $3.8 \times 10^4$ | 0.04 |
| Sample 5 | $5 \times 10^{13}$ | *1.85 | $6.5 \times 10^4$ | 0.06 |
| Sample 6 | $5 \times 10^{13}$ | 2.92 | $2.7 \times 10^4$ | 0.05 |
| Sample 7 | $5 \times 10^{13}$ | 4.42 | $6.2 \times 10^4$ | 0.05 |

Note) In the table, the symbol * indicates that the condition marked is outside the range specified by the present invention.

With Sample 1, a high etch pit density after heat treatment of $8.7 \times 10^4$/cm$^3$ was observed since the cooling rate in the temperature range of 1150–1020° C. was not less than 2.5° C./min (i.e. rapid cooling) and the dopant nitrogen concentration was as high as $1.3 \times 10^{14}$ atoms/cm$^3$. This was due to a marked improvement in thermal stability of oxide precipitate nuclei owing to doping with a high concentration of nitrogen; at the same time, the density of epitaxial layer defects showed a marked increase. Therefore, it is seen that the doping with nitrogen at a higher nitrogen concentration than $1 \times 10^{14}$ atoms/cm$^3$ is undesirable since it increases epitaxial layer defects in the first method.

Samples 2 and 5, for which the dopant nitrogen concentration was not more than $1 \times 10^{14}$ atoms/cm$^3$ but the cooling rate in the temperature range of 1150–1020° C. was less than 2.5° C./min, namely outside the range specified by the present invention, had an etch pit density after heat treatment lower than $6.5 \times 10^3$/cm$^2$. The density of epitaxial layer defects was also low.

On the other hand, Samples 3, 4, 6 and 7, for which rapid cooling was employed at a rate of 2.7° C./min or more, could show an increased etch pit density after heat treatment and a reduced density of epitaxial layer defects. Thus, by carrying out the cooling as specified herein, it is possible to suppress the cohesion of voids incorporated at the solid-liquid interface and increase the residual void concentration to thereby promote the growth of oxide precipitate nuclei.

2-2 Example 5

In Example 5, for confirming the effects of the use of the fifth single crystal, p-type (100) silicon single crystals having the same diameter of 8 inches as in Example 3 were produced using a single crystal producing apparatus in which the heat shield shown in FIG. 8 was used. In the process of pulling up, the pulling rate was controlled at 1.3 mm/min so that the cooling rate in the temperature range of 1150–1020° C. might be not less than 2.7° C./min and the cooling rate in the temperature range of 1000–850° C. might be less than 1.2° C./min. The dopant nitrogen concentration was also varied and the single crystals were produced. The nitrogen concentrations and cooling rates employed in this example are shown in Table 3.

Wafers were sliced from the single crystals produced and, after surface polishing and washing, an epitaxial layer was grown thereon at a deposition temperature of 1150° C. and the density of epitaxial layer defects was measured with each wafer and the etch pit density after heat treatment generated in the wafer was measured in the same manner as in Example 1. The results of these measurements are shown in Table 3.

TABLE 3

| Sample | Nitrogen Content atoms/cm$^3$) | Cooling rate 1150–1020° C. (° C./min) | Cooling rate 1000–850° C. (° C./min) | Etch pit density (/cm$^2$) | Epitaxial layer defect density (defects/cm$^2$) |
|---|---|---|---|---|---|
| Sample 8 | 6 × 10$^{12}$ | 2.81 | 1.01 | 1.2 × 10$^4$ | 0.04 |
| Sample 9 | 4 × 10$^{13}$ | 2.85 | 1.06 | 5.6 × 10$^4$ | 0.05 |
| Sample 10 | 5 × 10$^{12}$ | 2.88 | *3.6 | 7.5 × 10$^3$ | 0.03 |
| Sample 11 | 4 × 10$^{13}$ | 2.85 | *3.5 | 2.4 × 10$^4$ | 0.04 |

Note) In the table, the symbol * indicates that the condition marked is outside the range specified by the present invention.

It is evident that Samples 8 to 11 all satisfied the cooling conditions requirement for the first method and that, therefore, they showed a low epitaxial layer defect density and, with respect to the etch pit density after heat treatment, too, they each showed an improved result in its own way.

With Samples 8 and 9, which additionally satisfied the slow cooling conditions, namely a cooling rate not more than 1.2° C./min in the temperature range of 1000–850° C., as posed in relation to the method of producing the fifth single crystal, the density of epitaxial layer defects remained at a low level while a high etch pit density after heat treatment of not less than 1.2×10$^4$/cm$^2$ was secured even in Sample 8 in which the nitrogen concentration was low.

The failure to satisfy the cooling condition requirement for the second method is reflected in the results given by Samples 10 and 11. Comparison between Samples 9 and 11, for which the production conditions were almost the same except for the difference in cooling rate in the temperature range of 1000–850° C., reveals that the etch pit density after heat treatment was about twice in Sample 9, which satisfied the slow cooling condition for the second method.

As in the case of Samples 8 and 9, it is possible, by rapidly cooling the single crystal in the temperature range of 1150–1020° C. for swift passage thereof in that range, to suppress cohesion of vacancies incorporated at the solid-liquid interface and thus increase the residual void concentration to thereby causing the formation of oxide precipitate nuclei to start on the higher temperature side and promote the growth of oxide precipitate nuclei. Furthermore, by slow cooling in the temperature range of 1000–850° C., it is possible to further promote the growth of oxide precipitate nuclei.

2-3 Example 6

In Example 6, p-type (100) silicon single crystals having a diameter of 6 inches were produced (initial oxygen concentration; 1.2×10$^{18}$ atoms/cm$^3$ (ASTM '79)) for confirming the effects of the use of the sixth single crystal. The single crystals were produced by controlling the cooling rate in the temperature range of 1150–800° C. in the process of pulling up while adopting one of the two pulling rates, 1.2 mm/min and 1.9 mm/min. The dopant nitrogen concentration was as high as 5×10$^{14}$ atoms/cm$^3$. The conditions on that occasion are shown in Table 4.

Wafers were sliced from the single crystals produced and, after surface polishing and washing, an epitaxial layer was grown thereon at a deposition temperature of 1150° C. For each epitaxial wafer, the density of epitaxial layer defects was measured and the etch pit density after heat treatment generated in the wafer was determined in the same manner as in Example 4. The results of these measurements are shown in Table 4.

TABLE 4

| Sample | Nitrogen Content (atoms/cm$^3$) | Cooling rate 1150–800° C. (° C./min) | Etch pit density (/cm$^2$) | Epitaxial layer defect density (defects/cm$^2$) |
|---|---|---|---|---|
| Sample 12 | 5 × 10$^{14}$ | *4.1 | 4.8 × 10$^5$ | 2.5 |
| Sample 13 | 5 × 10$^{14}$ | 6.8 | 2.0 × 10$^5$ | 0.04 |
| Sample 14 | 2 × 10$^{15}$ | *4.1 | 1.2 × 10$^6$ | 3.8 |
| Sample 15 | 2 × 10$^{15}$ | 6.9 | 3.8 × 10$^5$ | 0.12 |

Note) In the table, the symbol * indicates that the condition marked is outside the range specified by the present invention.

For samples 12 and 14, the cooling rate in the temperature range of 1150–800° C. was 4.1° C./min, hence failed to meet the conditions imposed on the method of producing the sixth single crystal, so that, with Sample 12 (nitrogen concentration: 5×10$^{14}$ atoms/cm$^3$), the etch pit density after heat treatment was not less than 4.8×10$^5$/cm$^2$ and the density of epitaxial layer defects was also very high.

On the other hand, for Samples 13 and 15, the cooling was carried out under the conditions specified for the method of producing the sixth single crystal. Therefore, the etch pit density after heat treatment observed with Sample 13 (nitrogen concentration: 5×10$^{14}$ atoms/cm$^3$) was not less than 2.0×10$^5$/cm$^2$ and, at the same time, the density of epitaxial layer defects was also satisfactorily low; thus, high-quality epitaxial wafers free of defects in the device active region could be obtained.

As explained hereinabove, by the epitaxial wafer manufacturing method of the present invention, it is possible to obtain silicon single crystals for semiconductor device manufacture which have a reduced density of epitaxial layer defects and at the same time have high IG capability, even in the case of wafers prepared from nitrogen-doped silicon single crystals. Thus, when wafers sliced from such silicon single crystals are used, high-quality epitaxial wafers free of defects in the device active region can be manufactured.

What is claimed is:

1. A method of producing silicon single crystals crystals which comprises:

pulling up a silicon single crystal doped with $1\times10^{12}$ atoms/cm$^3$ to $1\times10^{14}$ atoms/cm$^3$ of nitrogen in the Czochralski method;

cooling the silicon single crystal with a cooling rate of not more than 1.2° C./min in the single crystal temperature range of 1000–850° C., wherein the singe crystal has an oxygen concentration of not less than $12\times10^{17}$ atoms/cm$^3$ (ASTM '79 value).

2. A method of producing silicon single crystals which comprises:

pulling up a silicon single crystal doped with $1\times10^{12}$ atoms/cm$^3$ to $1\times10^{14}$ atoms/cm$^3$ of nitrogen in the Czochralski method, with a cooling rate of not less than 2.7° C./min in the single crystal temperature range of 1150–1020° C.; and then cooling the silicon single crystal at a cooling rate of not more than 1.2° C./min in the single crystal temperature range of 1000–850° C., wherein the single crystal has an oxygen concentration of not less than $12\times10^{17}$ atoms/cm$^3$ (ASTM '79 value).

3. A method of producing silicon single crystals as claimed in any of claims 1 to 2, wherein the single crystal has an oxygen concentration of not less than $4\times10^{17}$ atoms/cm$^3$ (ASTM '79).

4. A method of manufacturing epitaxial wafers which comprises:

forming an epitaxial layer to grow on the surface of a silicon wafer sliced from a silicon single crystal doped with $1\times10^{12}$ atoms/cm$^3$ to $1\times10^{14}$ atoms/cm$^3$ of nitrogen as produced by the Czochralski method; and then cooling the epitaxial layer with a cooling rate of not more than 1.2° C./min in the single crystal temperature range of 1000–850° C., wherein the single crystal has an oxygen concentration of not less than $12\times10^{17}$ atoms/cm$^3$ (ASTM '79 value).

5. A method of manufacturing epitaxial wafers which comprises:

forming an epitaxial layer on the surface of a silicon wafer sliced from a silicon single crystal doped with $1\times10^{12}$ atoms/cm$^3$ to $1\times10^{14}$ atoms/cm$^3$ of nitrogen as produced by the Czochralski method by with a cooling rate of not less than 2.7° C./min in the single crystal temperature range of 1150–1020° C.; and then cooling the epitaxial layer at a cooling rate of not more than 1.2° C./min in the single crystal temperature range of 1000–850° C., wherein the single crystal has an oxygen concentration of not less than $12\times10^{17}$ atoms/cm$^3$ (ASTM '79 value).

* * * * *